Figure 1:
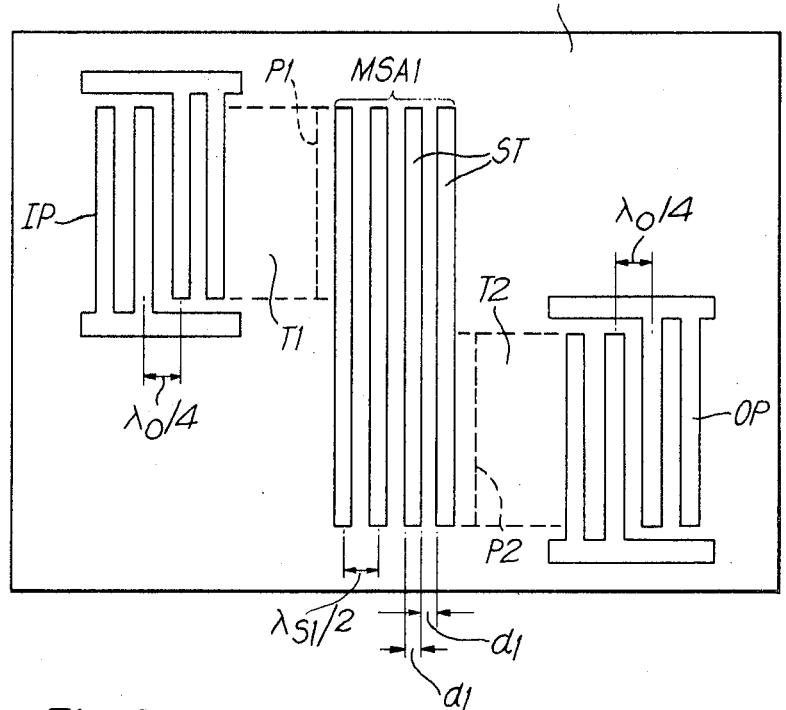

United States Patent [19]

Murray et al.

[11] 4,427,956
[45] Jan. 24, 1984

[54] ACOUSTIC WAVE BANDPASS ELECTRICAL FILTERS

[75] Inventors: Robert J. Murray, Horley; John Schofield, Coulsdon, both of England

[73] Assignee: U.S. Philips Corporation, New York, N.Y.

[21] Appl. No.: 367,491

[22] Filed: Apr. 12, 1982

[30] Foreign Application Priority Data

Apr. 22, 1981 [GB] United Kingdom ............... 8112452

[51] Int. Cl.³ ............................................. H03H 9/64
[52] U.S. Cl. ................................ 333/194; 310/313 D; 333/195; 333/196
[58] Field of Search ................ 333/193–196, 333/150–155; 310/313 R, 313 A, 313 B, 313 C, 313 D; 29/25.35

[56] References Cited

U.S. PATENT DOCUMENTS 4,336,515  6/1982  De Vries et al. .................. 333/195
4,357,584 11/1982  Murray et al. .................. 333/194 X
4,370,633  1/1983  Schofield ......................... 333/195

Primary Examiner—Marvin L. Nussbaum
Attorney, Agent, or Firm—Robert T. Mayer; Bernard Franzblau

[57] ABSTRACT

A surface acoustic wave bandpass electrical filter has double electrode input and output transducers (IP and OP) whose combined amplitude-frequency response has a fundamental passband centered on a frequency $f_o$ and a corresponding third harmonic passband. An interposed multistrip coupler (MSA2) has strips (ST) with a mark-to-space ratio of one-to-one and a center-to-center spacing $\lambda_{S2}/2$ chosen such that $f_o/f_{S2}$ is in the range 0.80 to 1.14 but excluding substantially 1.0, whereby a stopband in the amplitude-frequency response of the coupler (MSA2) between $2f_{S2}$ and $4f_{S2}$ suppresses the amplitude-frequency response of the input and output transducers (IP and OP) over a range of frequencies including $3f_o \pm 0.5f_o$.

1 Claim, 5 Drawing Figures

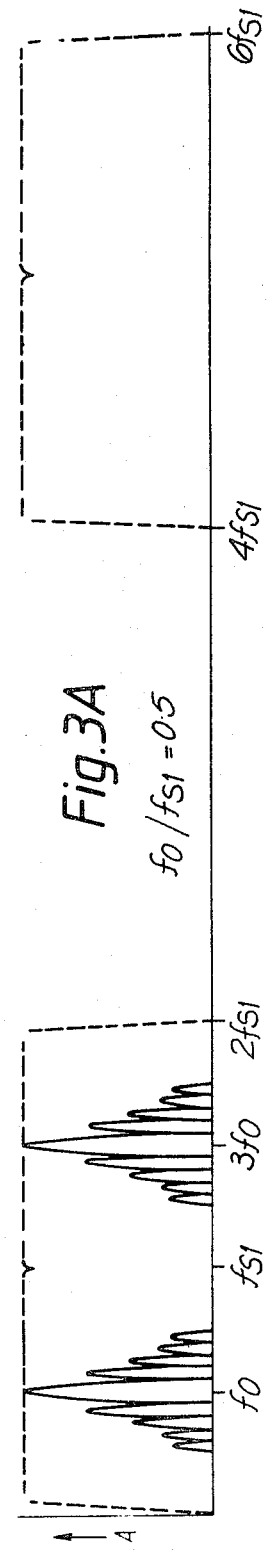
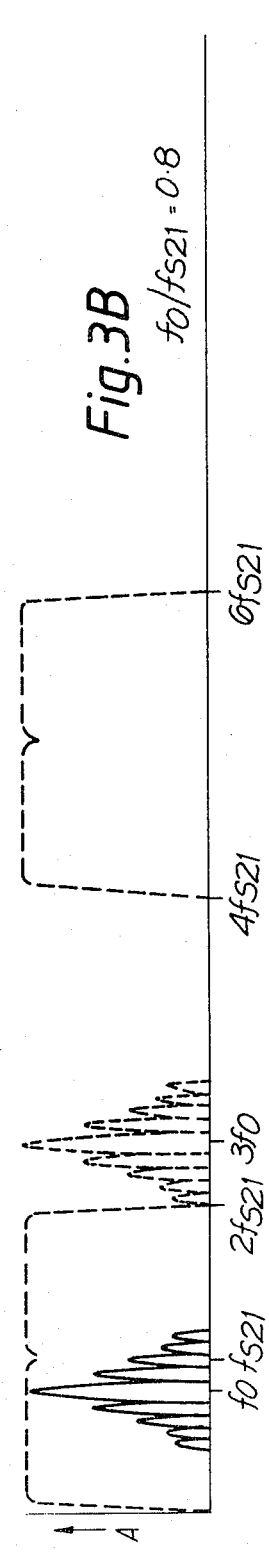
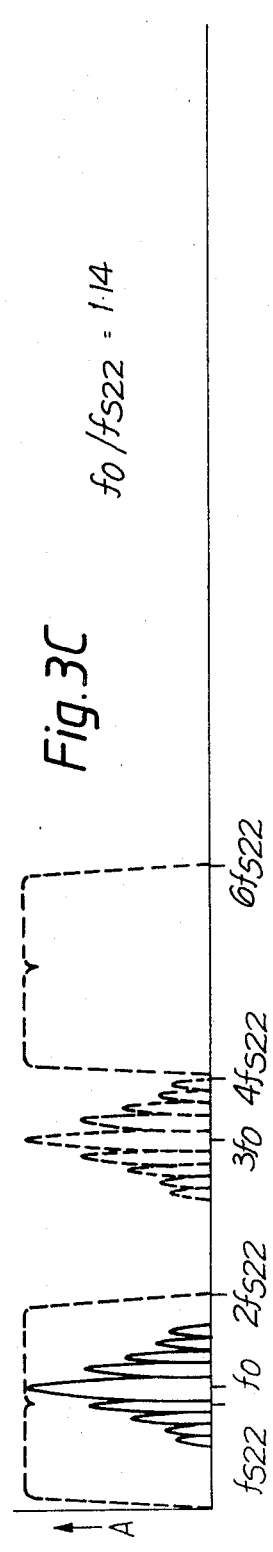

ACOUSTIC WAVE BANDPASS ELECTRICAL FILTERS

The present invention relates to acoustic wave bandpass electrical filters, and in particular to such devices including a track changing multistrip array arranged between input and output transducers on a substrate able to propagate acoustic waves at a surface thereof.

Surface acoustic wave (SAW) bandpass electrical filters are well known which consist of an input interdigital transducer and an output interdigital transducer with an interposed track changing multistrip array on a high coupling piezoelectric substrate, e.g. Y-Z lithium niobate. The combined amplitude-frequency response of the two transducers has a passband which is substantially the desired passband of the filter. The major advantage of the multistrip array in these filters is that it provides relative suppression of bulk wave spuriae, and a further advantage is that it allows apodization weighting of both transducers.

The amplitude-frequency response of each transducer in these filters has a fundamental passband and further passbands at particular harmonics dependent on the sampling configuration of the transducers, that is to say the centre-to-centre separation period, the electrode polarity sequence and the mark-to-space ratio of the transducer electrodes. If the input and output transducers have different sampling configurations then this may result in suppression of certain of these harmonic passbands in the combined amplitude-frequency response of the filter; this suppression will not occur if the two transducers have the same sampling configuration. An interdigital transducer having electrodes with a centre-to-centre separation period of a quarter wavelength of surface acoustic waves at the centre frequency of the fundamental passband, known as a double or split electrode transducer, and with an electrode mark-to-space ratio of one-to-one has, as the nearest further passband to the fundamental passband, a third harmonic passband response which is of nearly equal amplitude to that of the fundamental passband. A major advantage of the double electrode configuration transducer is that interactions within the transducer which cause undesired ripples in the amplitude-frequency response are minimised, and for this reason it is common to use this configuration for both the input and output transducers. However, the unsuppressed third harmonic response resulting from this use can be a significant disadvantage in certain filter applications.

A paper entitled "The use of frequency-selective multistrip couplers in surface acoustic wave transversal filters" has been presented by the present inventors at the 1980 IEEE Ultrasonics Symposium. In this paper an analysis technique is described for multistrip couplers which may have arbitrary specified geometry. As part of this analysis a single strip within a multistrip coupler is represented as a single electrode transducer in each track with a capacitive load connecting these two electrodes. Also a formula is given for the effective coupling coefficient of the piezoelectric substrate on the assumption that the mark-to-space ratio of the strips is substantially one-to-one with an indication of how to vary a factor in that formula if the mark-to space ratio varies. It is stated that this analysis technique is valid in the frequency range approximately 0 to $2f_s$ where $f_s$ is the mean stopband frequency of the coupler. This frequency $f_s$ is well known as the frequency at which the centre-to-centre spacing of the strips of a multistrip coupler is half a wavelength of surface acoustic waves. This paper then proposes that a notch may be put into the frequency response of a forward transfer multistrip coupler by putting a jog into one track. In this case the centre-to-centre strip spacing is d in both tracks, except at the jog in one track where the spacing is $d+d_o$. To suppress the third harmonic of a frequency $f_o$ (wavelength $\lambda_o$) $d_o$ is set to $\lambda_o/6$. As an example of the properties of a thrid harmonic trap multistrip coupler, FIG. 5 of this paper shows the theoretically predicted responses for two multistrip couplers, one conventional and one with a third harmonic jog. The ratio $f_o/f_s$ is 0.5 in each case. The two responses are shown as braodband responses between 0 and $4f_o$, each with the well-known notch at the frequency $f_s$ and the jogged multistrip coupler additionally having a deep trap centred on $3f_o$.

An object of the invention is to enable the above-mentioned disadvantages of an unsuppressed third harmonic response to be overcome by means which may be used as an alternative or in addition to the jog geometry proposed in the above-described 1980 Ultrasonics Symposium paper.

This invention is based on the combination of two factors. The first factor is the realisation that if the analysis in the above-described 1980 Ultrasonics Symposium paper, in which the environment of a single strip within a multistrip coupler is considered to be similar to a single electrode within an interdigital transducer, is extended in the special case where the mark-to-space ratio of the strips is substantially one-to-one, then the wideband frequency response of a single strip imposes a stopband in the amplitude-frequency response of the multistrip coupler between $2f_s$ and $4f_s$. The second factor is the realisation that by a suitable choice of the ratio $f_o/f_s$, that is to say a choice of the centre-to-centre spacing of the strips relevant to $f_o$, this stopband may be used to suppress the third harmonic passband of a surface acoustic wave bandpass filter and the response of the filter over a range of frequencies near that third harmonic passband.

According to the invention there is provided an acoustic wave bandpass electrical filter including a substrate able to propagate acoustic waves at a surface thereof, input transducing means arranged to launch acoustic wave energy along a first propagation track at said surface, output transducing means arranged to receive acoustic wave energy from a second propagation track at said surface, and electrical coupling means arranged to receive acoustic wave energy from the input transducing means in the first track and to re-launch at least part of that energy as acoustic wave energy towards the output transducing means in the second track, in which the combined amplitude-frequency response of the input and output transducing means has a fundamental passband which is substantially the desired passband of the filter with a maximum amplitude response substantially at a frequency $f_o$ and has a corresponding third harmonic passband, and in which the coupling means consists of an array of conducting strips across the first track and an array of conducting strips across the second track, the conducting strips of each array being discrete parallel strips electrically insulated from each other and strips of the two arrays being electrically connected in pairs with each pair consisting of one strip from each array, at least the majority of the strips of both arrays of the coupling means having a mark-to-space ratio of substantially one-to-one, characterised in that $f_o/f_s$ is in the range 0.80 to 1.14 but excluding substantially 1.0, 1 $f_s$ being the frequency at which the centre-to-centre spacing of at least the majority of said strips is half a wavelength of said acoustic waves, whereby a stopband in the amplitude-frequency response of the coupling means between $2f_s$ and $4f_s$ suppresses the amplitude-frequency response of the input and output transducing means over a range of frequencies including $3f_o \pm 0.5\ f_o$.

In many surface acoustic wave bandpass electrical filters incorporating double electrode transducers with an interposed multistrip coupler, for example some of those used as television intermediate frequency filters, the strips of the coupler have the same mark-to-space ratio and the same centre-to-centre spacing as the electrodes of the transducers. In this case $f_o/f_s = 0.5$. This configuration of the coupler strips has apparently been adopted as a matter of convenience and therefore no particular attention has apparently been paid to the statement in the well known paper by F. G. Marshall et al. in IEEE Transactions, Vol. MTT-21, No. 4, April 1973, pages 216 to 225, at page 216 that "a useful rule of thumb is to set the working frequency at approximately three quarters of the stopband frequency". The accompanying other well known paper by F. G. Marshall et al. in IEEE Transactions, Vol. MTT-21, No. 4, April 1973, pages 206 to 215, mentions on page 212 a working range for a multistrip coupler of $0.6f_s$ to $0.85f_s$. The statement in the first-mentioned Marshall paper is in relation to a formula for the minimum number of strips required for complete transfer, and the range mentioned in the second-mentioned Marshall paper is in relation to a theoretical investigation of the transmission and reflection properties of a multistrip coupler. Both these papers are concerned with the passband bandwidth of multistrip couplers and both recommend that the working frequency should not be above the stopband frequency. These two papers by F. G. Marshall et al. do not consider practical bandpass surface acoustic wave filters and they do not consider the problem of unwanted harmonic responses of such filters. Furthermore they do not contain any teaching concerning a stopband in the multistrip coupler response between $2f_s$ and $4f_s$. Thus they do not disclose acoustic wave bandpass filters according to the present invention, and they do in any way detract from the inventive step involved in the above-mentioned combination of two factors upon which the present invention is based. In the book "Topics in Applied Physics—Acoustic Surface Waves," Edited by A. A. Oliner, Springer-Verlag, 1978 the two above-mentioned F. G. Marshall papers are referred to and at page 172 it is stated that multistrip couplers are operated at frequencies ranging from perhaps $0.3f_s$ to $0.9f_s$. However this statement does not detract from the novelty or inventive step of the present invention for the same reasons as discussed above in relation to the two F. G. Marshall papers.

In devices according to the invention the acoustic waves which the substrate is able to propagate at a surface thereof may be conventional surface acoustic waves propagating in the surface of the substrate. The acoustic waves may otherwise be, for example, bulk acoustic waves propagating parallel and close to that surface of the substrate; the possible use of this type of bulk acoustic wave is mentioned in connection with delay line feedback oscillators in U.K. patent specification No. 1,451,326 and a range of rotated Y-cuts of quartz with propagation perpendicular to the X-axis suitable for this purpose is described in Electronics Letters, 3rd March 1977, Vol. 13, No. 5 at pages 128 to 130. The acoustic waves may also otherwise be, for example, piezoelectric leaky surface waves propagating along the X axis of a 41° or 64° rotated Y-cut plane of lithium niobate as described in an article by K. Yamanouchi and K. Shibayama in Journal of Applied Physics, Vol. 43, No. 3, March 1972 at pages 856 to 862.

Figure 2:
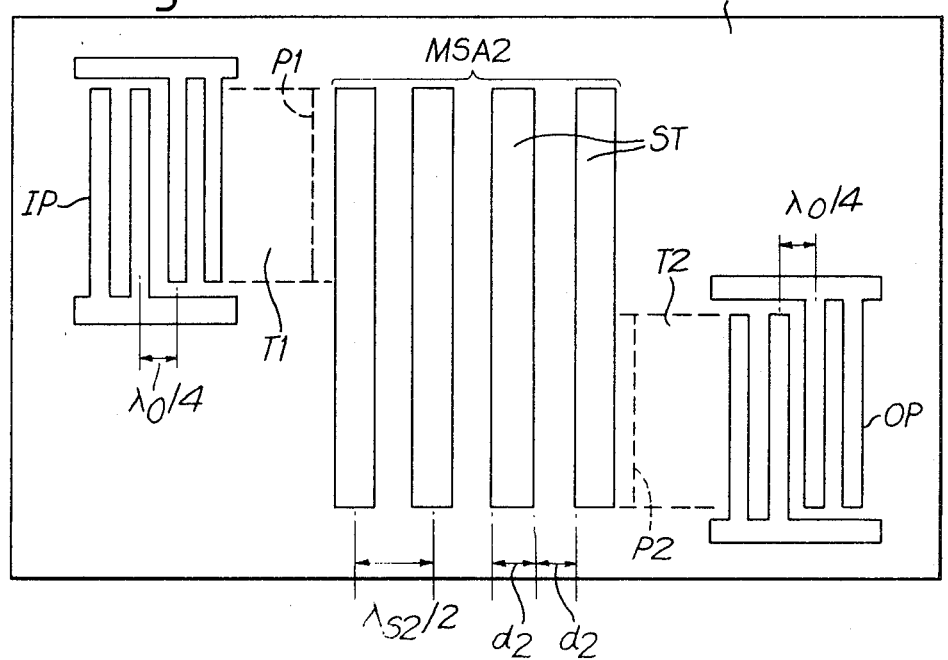

The invention will now be described in more detail with reference to the accompanying drawings, in which:

FIG. 1 shows schematically in plan view a known surface acoustic wave bandpass electrical filter incorporating double electrode input and output interdigital transducers with an interposed conventional track changing multistrip coupler, FIG. 2 shows the filter of FIG. 1 with a modified multistrip coupler according to the invention for providing suppression of the amplitude-frequency filter response over a range of frequencies including the third harmonic filter response, FIG. 3A shows the amplitude-frequency response of the filter of FIG. 1 including a fundamental passband response and a third harmonic passband response which is not suppressed by the amplitude-frequency response of the conventional multistrip coupler, and FIGS. 3B and 3C show the amplitude-frequency response of two filters, each with a different example of a modified multistrip coupler as shown in FIG. 2, each filter response including a fundamental passband response and a third harmonic passband response which is suppressed by a stopband in the amplitude-frequency response of the modified multistrip coupler.

Referring now to FIG. 1 there is shown a substrate SU able to propagate surface acoustic waves at a surface thereof, input transducing means IP arranged to launch surface acoustic wave energy along a first propagation track T1 at the surface, output transducing means OP arranged to receive surface acoustic wave energy from a second propagation track T2 at the surface and electrical coupling means MSA1 arranged to receive surface acoustic wave energy from the input transducing means IP in the first track T1 via an input port P1 and to relaunch at least part of that energy as surface acoustic wave energy towards the output transducing means OP in the second track T2 via an output port P2.

The input transducing means Ip and the output transducing means OP are both interdigital transducers comprising double electrodes, that is to say having electrodes with a centre-to-centre separation period of a quarter wavelength $\lambda_o/4$ of surface acoustic waves at the centre frequency (substantially the maximum amplitude response frequency) $f_o$ of a fundamental passband of the amplitude-frequency response of the transducer, and the mark-to-space ratio of the electrodes of the transducers is one-to-one. The combined amplitude-frequency response of the transducers IP and OP has harmonically repeated passbands of predetermined shape, including a fundamental passband centred at the frequency $f_o$ which is substantially the desired passband of the electrical filter formed by the device and a third harmonic passband at a frequency $3f_o$ which is of nearly equal amplitude to that of the fundamental passband.

The electrical coupling means MSA1 consists of an array of a number of discrete parallel conducting strips ST electrically insulated from each other. Each strip ST may be considered as a pair of strips in which one strip of the pair is part of an array of strips across the track T1, the other strip of the pair is part of an array of strips across the track T2 and the two strips of each pair are electrically connected.

The array MSA1 is a conventional track changing multistrip coupler in that the centre-to-centre separation period $\lambda_{S1}/2$ between the strips ST is constant for the array of strips in each of the tracks T1 and T2 and is the same in both tracks, and in that width of the strips and their separation have the same value $d_1$ i.e. the mark-to-space ratio of the strips is one-to-one. The centre-to-centre separation period $\lambda_{S1}/2$ is half a wavelength of surface acoustic waves at the well known mean stopband frequency $f_{S1}$ of the coupler. The device is furthermore of a wellknown configuration in that the strips of the coupler have the same mark-to-space ratio and the same centre-to-centre spacing as the electrodes of the transducers; thus $\lambda_o/4 = \lambda_{S1}/2$ and so $f_o/f_{S1} = 0.5$.

Referring now to FIG. 2, there is shown the filter of FIG. 1 with a modified multistrip coupler MSA2 according to the invention. The centre-to-centre separation period $\lambda_{S2}/2$ between the strips ST is still constant for the array of strips in each of the tracks T1 and T2 and is the same in both tracks, and the mark-to-space ratio of the strips is still one-to-one based on a distance $d_2$. The modification resides in choosing the value of $\lambda_{S2}/2$ such that $f_o/f_{S2}$ is in the range 0.80 to 1.14 but excluding substantially 1.0.

Referring now to FIG. 3A, the solid line curve centred on $f_o$ shows the combined amplitude-frequency response of the transducers IP and OP of the device of FIG. 1, including the fundamental passband which is substantially the desired passband of the electrical filter formed by the device and four side lobes on either side of the fundamental passband extending over a frequency range $f_o \pm 0.5f_o$, which is the frequency range outside which side lobes of significant amplitude will not usually be present. The solid line curve centred on $3f_o$ shows a substantially repeat amplitude-frequency response of the device including a third harmonic passband at $3f_o$ and side lobes over a frequency range $3f_o \pm 0.5f_o$. The dashed line curve shows the wideband amplitude-frequency response of the multistrip coupler MSA1 over the frequency range 0 to $6f_{S1}$ which includes a passband between 0 and $2f_{S1}$, a stopband between $2f_{S1}$ and $4f_{S1}$ and a further passband between $4f_{S1}$ and $6f_{S1}$; the well known stopband frequency $f_{S1}$ notch in the multistrip coupler response is also shown. The amplitude-frequency response of a multistrip coupler over a range of frequencies 0 to $6f_{S1}$, restricted to the special case where the mark-to-space ratio of the strips is substantially one-to-one and showing that in this case the wideband frequency response of a single strip imposes a stopband in the response of the multistrip coupler between $2f_{S1}$ and $4f_{S1}$, has not previously been shown. FIG. 3A shows that in the known device of FIG. 1, where $f_o/f_{S1} = 0.5$, the amplitude-frequency response of the input and output transducers over the frequency range $3f_o \pm 0.5f_o$ is whollyu within the multistrip coupler passband between 0 and $2f_{S1}$ and is not suppressed by the multistrip coupler stopband between $2f_{S1}$ and $4f_{S1}$.

Referring now to FIGS. 3B and 3C the solid line curve in each case shows the combined amplitude-frequency response of the transducers IP and OP of the device of FIG. 2 over a frequency range $f_o \pm 0.5f_o$, and the dotted line curve in each case shows the response of these transducers over a frequency range $3f_o \pm 0.5f_o$ which is within the stopband in the dashed line response of the multistrip coupler MSA2 and is therefore suppressed in the response of the device including that coupler.

FIG. 3B shows the case in which the centre-to-centre spacing of the strips of the multistrip coupler MSA2 is chosen such that $3f_o - 0.5f_o = 2f_{S21}$, which determines the ratio $f_o/f_{S21} = 0.8$. FIG. 3C shows the case in which the centre-to-centre spacing of the strips of the multistrip coupler MSA2 is chosen such that $3f_o + 0.5f_o = 4f_{S22}$, which determines the ratio $f_o/f_{S22} = 1.14$. Thus FIGS. 3B and 3C show the limits of the range of the centre-to-centre spacing of the strips of the multistrip coupler according to the invention. Within this range it will be apparent that the centre-to-centre strip spacing at which $f_o/f_s$ is substantially 1.0 must be excluded, that is to say that the notch in the multistrip coupler response at the well-known mean stopband frequency $f_s$ ($f_{S21}$ in FIG. 3B and $f_{S22}$ in FIG. 3C) must be separated from the fundamental passband at the frequency $f_o$ which is substantially the desired passband of the electrical filter fromed by the device.

Some possible variations within the invention of the multistrip coupler array MSA2 shown in FIG. 2 will now be described. In the array MSA2 the width and spacing of all the strips ST is the same distance $d_2$, and furthermore the centre-to-centre spacing of all the strips ST is the same distance $\lambda_{S2}/2$. It is not necessary for all the strips to conform to the regular spacings $d_2$ and $\lambda_{S2}/2$; it is sufficient if each of these spacings is conformed to by at least the majority of the strips of the multistrip coupler so that the multistrip coupler amplitude-frequency response has the characteristic illustrated in FIGS. 3A to 3C that a stopband is imposed on that response in the frequency range $2f_s$ to $4f_s$ where $f_s$ is the well known mean stopband frequency at which a notch occurs. Thus it is possible for the third harmonic suppression technique according to this invention to be used together with the jog geometry described by the present inventors in the above-described 1980 Ultrasonics Symposium paper; this jog technique has also been disclosed in Electronics Letters, May 9, 1980, Vol. 16, No. 10, pages 356 to 358. The above-described 1980 Ultrasonics Symposium paper also discusses what is known as a group weighted bandpass multistrip coupler. In this type of bandpass multistrip coupler, which is also known from an article by L. P. Solie in Applied Physics Letters, Vol. 30, No. 8, April 15, 1977, the strips of a multistrip array are arranged in groups so as to provide a shaped passband amplitude-frequency response for the multistrip coupler. This shaped passband will be a fundamental passband and will have some harmonically repeated passbands. It is considered possible for the third harmonic suppression technique according to this invention to be used together with this group weighting technique, in which case the shaped fundamental and harmonically repeated passbands of the multistrip coupler will be subject to the stopband in the frequency range $2f_s$ to $4f_s$. The jog geometry described in the above-mentioned Ultrasonics Symposium paper and Electronics Letter, which may also be group-weighted, is the subject of our U.S. patent application Ser. No. 236,424, now U.S. Pat. No. 4,357,584. A modified jog geometry, which can also be used together with the technique of this invention, is the subject of our U.S. patent application Ser. No. 236,357, now U.S. Pat. No. 4,370,633.

We claim:

1. An acoustic wave bandpass electrical filter including a substrate able to propagate acoustic waves at a surface thereof, input transducing means arranged to launch acoustic wave energy along a first propagation track at said surface, output transducing means arranged to receive acoustic wave energy from a second propagation track at said surface, and electrical coupling means arranged to receive acoustic wave energy from the input transducing means in the first track and to relaunch at least part of that energy as acoustic wave energy towards the output transducing means in the second track, in which the combined amplitude-frequency response of the input and output tranducing means has a fundamental passband which is substantially the desired passband of the filter with a maximum amplitude response substantially at a frequency $f_o$ and has a corresponding third harmonic passband, and in which the coupling means consists of an array of conducting strips across the first track and an array of conducting strips across the second track, the conducting strips of each array being discrete parallel strips electrically insulated from each other and strips of the two arrays being electrically connected in pairs with each pair consisting of one strip from each array, at least the majority of the strips of both arrays of the coupling means having a mark-to-space ratio of substantially one-to-one, characterised in that $f_o/f_s$ is in the range 0.80 to 1.14 but excluding substantially 1.0, $f_s$ being the frequency at which the centre-to-centre spacing of at least the majority of said strips is half a wavelength of said acoustic waves, whereby a stopband in the amplitude-frequency response of the coupling means between $2f_s$ and $4f_s$ suppresses the amplitude-frequency response of the input and output transducing means over a range of frequencies including $3f_o \pm 0.5f_o$.

* * * * *

UNITED STATES PATENT AND TRADEMARK OFFICE
CERTIFICATE OF CORRECTION

PATENT NO. : 4,427,956

DATED : January 24, 1984

INVENTOR(S) : ROBERT J. MURRAY ET AL

It is certified that error appears in the above-identified patent and that said Letters Patent is hereby corrected as shown below:

Col. 1, line 32, change "; this" to --.  This--

Col. 3, line 46, after "do" insert --not--

Col. 3, line 65, change "; the" to --.  The--

Col. 5, line 10, after "that" insert --the--

Col. 5, line 11, after "d₁" insert --,-- (comma)

Col. 5, line 48, change "; the" to --.  The--

Col. 6, line 31, change "; it" to --.  It--

Col. 6, line 42, change "; this" to --.  This--

UNITED STATES PATENT AND TRADEMARK OFFICE
CERTIFICATE OF CORRECTION

PATENT NO. : 4,427,956

DATED : January 24, 1984

INVENTOR(S) : ROBERT J. MURRAY ET AL

It is certified that error appears in the above-identified patent and that said Letters Patent is hereby corrected as shown below:

Claim 1, col. 7, line 1 and 2 change "including" to --comprising--

Claim 1, col. 7, line 18, change "consists of" to --includes--

Claim 1, col. 8, line 6, change "consisting of" to --comprising--

Signed and Sealed this

Eighth Day of May 1984

[SEAL]

Attest:

GERALD J. MOSSINGHOFF

Attesting Officer

Commissioner of Patents and Trademarks